(12) United States Patent
Lawson

(10) Patent No.: US 10,892,755 B2
(45) Date of Patent: *Jan. 12, 2021

(54) DRIVER CIRCUITRY FOR FAST, EFFICIENT STATE TRANSITIONS

(71) Applicant: CogniPower, LLC, Malvern, PA (US)

(72) Inventor: Thomas E. Lawson, Malvern, PA (US)

(73) Assignee: CogniPower, LLC, Malvern, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/915,464

(22) Filed: Jun. 29, 2020

(65) Prior Publication Data
US 2020/0328747 A1  Oct. 15, 2020

Related U.S. Application Data

(63) Continuation-in-part of application No. 16/740,908, filed on Jan. 13, 2020, now Pat. No. 10,812,077, (Continued)

(51) Int. Cl.
*H03K 19/003* (2006.01)
*H03K 17/30* (2006.01)

(52) U.S. Cl.
CPC ....... *H03K 19/00307* (2013.01); *H03K 17/30* (2013.01); *H03K 19/00353* (2013.01)

(58) Field of Classification Search
CPC ............. H03K 19/00307; H03K 17/79; H03K 17/615; H03K 17/60; H03K 17/30; H03K 19/00353; H03K 19/0024; H03K 19/00376
See application file for complete search history.

(56) References Cited

U.S. PATENT DOCUMENTS 3,321,685 A  5/1967  Johannes
3,889,173 A  6/1975  Klusmann et al.
(Continued)

FOREIGN PATENT DOCUMENTS

EP  2717449 A1  4/2014

OTHER PUBLICATIONS

Power Integrations Design Example Report, "3 W Single Output, <10 mW No-load Consumption, Isolated Adapter Using LinkSwitch-XT", Applications Engineering Department, DER-227, Oct. 6, 2009, Revision 1.1, pp. 1-28, Retrieved from http://www.powerint.com/sites/default/files/PDFFiles/der227.pdf.
(Continued)

*Primary Examiner* — Patrick C Chen
(74) *Attorney, Agent, or Firm* — Mendelsohn Dunleavy, P.C.; Steve Mendelsohn

(57) ABSTRACT

In certain embodiments, driver circuitry generates drive signals to drive driven circuitry to transition between first and second states. The driver circuitry has a first-to-second driver circuit that generates a first drive signal to drive the driven circuitry to transition from the first state to the second state and a second-to-first driver circuit that generates a second drive signal to drive the driven circuitry to transition from the second state to the first state. The driver circuitry includes two complementary triggered current pulse generators (described in U.S. Pat. No. 10,554,206) that combine to efficiently provide switch drive for a FET or other reactive load. The triggered drive has fast edges for low switching losses. In certain embodiments, the low power triggered drive circuitry can respond to a slowly changing feedback signal to switch a FET so as to regulate a power converter output.

12 Claims, 5 Drawing Sheets

Related U.S. Application Data which is a continuation of application No. 16/281,384, filed on Feb. 21, 2019, now Pat. No. 10,554,206.

(60) Provisional application No. 62/869,143, filed on Jul. 1, 2019, provisional application No. 62/754,628, filed on Nov. 2, 2018, provisional application No. 62/635,584, filed on Feb. 27, 2018.

(56) References Cited

U.S. PATENT DOCUMENTS

| | | | |
|---|---|---|---|
| 4,119,103 A | | 10/1978 | Jirak |
| 4,209,847 A | | 6/1980 | Noda et al. |
| 4,438,486 A | | 3/1984 | Ferraro |
| 4,459,651 A | | 7/1984 | Fenter |
| 4,539,493 A | * | 9/1985 | Varadarajan ....... H03K 19/0136 326/126 |
| 4,597,036 A | | 6/1986 | Paulik et al. |
| 4,758,937 A | | 7/1988 | Usui et al. |
| 4,937,727 A | | 6/1990 | Leonardi |
| 4,958,268 A | | 9/1990 | Nagagata et al. |
| 4,996,638 A | | 2/1991 | Orr |
| 5,161,022 A | | 11/1992 | Ichimura et al. |
| 5,498,995 A | | 3/1996 | Szepesi et al. |
| 5,546,040 A | | 8/1996 | McCall et al. |
| 5,642,267 A | | 6/1997 | Brkovic et al. |
| 5,687,068 A | | 11/1997 | Jamieson et al. |
| 5,719,755 A | | 2/1998 | Usui |
| 5,751,171 A | | 5/1998 | Ngo |
| 5,825,640 A | * | 10/1998 | Quigley ................ H03L 7/0895 363/60 |
| 5,973,945 A | | 10/1999 | Balakrishnan et al. |
| 5,986,484 A | | 11/1999 | Kimata |
| 6,072,702 A | | 6/2000 | Nakao et al. |
| 6,301,135 B1 | | 10/2001 | Mammano et al. |
| 6,356,099 B1 | * | 3/2002 | Lee ...................... H03K 3/3565 326/24 |
| 6,456,511 B1 | | 9/2002 | Wong |
| 6,504,267 B1 | | 1/2003 | Giannopoulos |
| 6,563,718 B1 | | 5/2003 | Li et al. |
| 6,738,267 B1 | | 5/2004 | Navas Sabater et al. |
| 7,368,880 B2 | | 5/2008 | Lyle, Jr. et al. |
| 7,450,402 B2 | | 11/2008 | Jitaru |
| 7,835,163 B2 | | 11/2010 | Chou |
| 7,876,583 B2 | | 1/2011 | Polivka et al. |
| 8,000,115 B2 | | 8/2011 | Polivka et al. |
| 8,125,799 B2 | | 2/2012 | Zhu et al. |
| 8,243,477 B2 | | 8/2012 | Polivka et al. |
| 8,823,353 B2 | | 9/2014 | Zhang et al. |
| 8,976,561 B2 | | 3/2015 | Balakrishnan |
| 9,035,435 B2 | | 5/2015 | Balakrishnan et al. |
| 9,083,251 B2 | | 7/2015 | Zhang et al. |
| 9,178,411 B2 | | 11/2015 | Djenguerian et al. |
| 9,246,392 B2 | | 1/2016 | Balakrishnan et al. |
| 9,275,946 B2 | | 3/2016 | Balakrishnan et al. |
| 9,374,019 B2 | | 6/2016 | Li et al. |
| 10,008,942 B1 | | 6/2018 | Horwitz et al. |
| 2004/0238129 A1 | * | 12/2004 | Hsu ........................ E06B 9/262 160/84.04 |
| 2005/0254266 A1 | | 11/2005 | Jitaru |
| 2006/0267514 A1 | | 11/2006 | Xu |
| 2007/0024254 A1 | | 2/2007 | Radecker et al. |
| 2008/0181316 A1 | | 7/2008 | Crawley et al. |
| 2008/0267212 A1 | | 10/2008 | Crawley et al. |
| 2008/0278975 A1 | | 11/2008 | Degen et al. |
| 2008/0303560 A1 | | 12/2008 | Higashi et al. |
| 2008/0310191 A1 | | 12/2008 | Zhu et al. |
| 2010/0026268 A1 | | 2/2010 | Chang et al. |
| 2010/0157630 A1 | | 6/2010 | Polivla et al. |
| 2010/0231279 A1 | | 9/2010 | Walker et al. |
| 2011/0018590 A1 | | 1/2011 | Tai et al. |
| 2011/0022867 A1 | | 1/2011 | Chang et al. |
| 2011/0026277 A1 | | 2/2011 | Strijker |
| 2011/0096573 A1 | | 4/2011 | Zhu et al. |
| 2011/0096578 A1 | | 4/2011 | Fang et al. |
| 2012/0153921 A1 | | 6/2012 | Brokaw |
| 2012/0281439 A1 | | 11/2012 | Polivka et al. |
| 2013/0100710 A1 | | 4/2013 | Kang et al. |
| 2013/0299841 A1 | | 11/2013 | Ranglack et al. |
| 2016/0079877 A1 | | 3/2016 | Lin et al. |
| 2019/0238129 A1 | * | 8/2019 | Fukushima .......... H03K 17/163 |

OTHER PUBLICATIONS

Frank R., et al. "LM3001/LM3101 A 1 MHz Off-Line Pwm Controller Chipset with Pulse Communication for Voltage-Current- or Charge-Mode Control," 1994, National Semiconductor Application Note 918, pp. 1-8.

"Feedback Isolation Augments Power-Supply Safety and Performance," Jan. 22, 2001, Maxim, as retrieved from: https://www.maximintegrated.com/en/app-notes/index.mvp/id/664, 6 pages.

"Isolated Transformer Driver for PCMIA Applications," as retrieved from: https://www.maximintegrated.com/en/products/power/isolated-power/MAX845.html, Feb. 2017, pp. 1-15.

"12V or Adjustable, High-Efficiency, Low IQ, Step-Up DC-DC Controller," as retrieved from: https://www.maximintegrated.com/en/products/power/switching-regulators/MAX1771.html, Feb. 2017, pp. 1-16.

"LTC3706: Secondary-Side Synchronous Forward Controller with PolyPhase Capability," Linear Technology, 2005, pp. 1-22 as retrieved from: http://www.linear.com/product/LTC3706#notify.

"LTC3725: Single-Switch Forward Controller and Gate Driver," Linear Technology, 2005, pp. 1-20 as retrieved from: of http://www.linear.com/product/LTC3725.

"MAX630/MAX4193: CMOS Micropower Step-Up Switching Regulator," Maxim, 2008, pp. 1-14, as retrieved from: https://www.maximintegrated.com/en/products/power/MAX4193.html.

"LM3001 Primary-Side PWM Driver," 1995, National Semiconductor, 21 pages.

"LM3101 Secondary-Side PWM Controller," 1995, National Semiconductor, pp. 1-20.

Vu, Tue T. et al. "Primary-side sending for a flyback converter in both continuous and discontinuous conduction mode," IET Irish Signals and Systems Conference (ISSC 2012), Jun. 2012, pp. 1-6, IET, Maynooth, Ireland.

* cited by examiner

100

DRIVER CIRCUITRY FOR FAST, EFFICIENT STATE TRANSITIONS

CROSS-REFERENCE TO RELATED APPLICATIONS

This application is a continuation-in-part of U.S. patent application Ser. No. 16/740,908, filed on Jan. 13, 1920, which is a continuation of U.S. patent application Ser. No. 16/281,384, filed on Feb. 21, 2019 and issued as U.S. Pat. No. 10,554,206 on Feb. 4, 20200, which claims the benefit of the filing date of U.S. provisional application No. 62/635,584, filed on Feb. 27, 2018, and U.S. provisional application No. 62/754,628, filed on Nov. 2, 2018, the teachings of all of which are incorporated herein by reference in their entirety. This application also claims the benefit of U.S. provisional application No. 62/869,143, filed on Jul. 1, 2019.

BACKGROUND

Field of the Invention

The present invention relates to electronics and, more particularly but not exclusively, to driver circuits for driven circuits having state transitions, such as pulse generators and switch drivers used to control input switches in power converters such as described in U.S. Pat. Nos. 8,004,344 and 9,071,152, U.S. Reissue Pat. Nos. RE47,031, RE47,713, and RE47,714, and U.S. patent application Ser. Nos. 16/547,850 and 16/548,897, the teachings of which are incorporated herein by reference in their entirety.

Description of the Related Art

This section introduces aspects that may help facilitate a better understanding of the invention. Accordingly, the statements of this section are to be read in this light and are not to be understood as admissions about what is prior art or what is not prior art.

In a switched-mode power converter, controlled pulses are applied to quickly charge or discharge the gate of a power FET switch. During time spent turning on or turning off, the switch is in an intermediate state causing energy to be dissipated in wasteful fashion. In a power converter, it is often desirable for a slowly changing feedback signal to cause a switch transition at a particular threshold voltage. A comparator may be used to generate such a digital event, but a conventional comparator cannot directly drive the capacitance of a power FET switch. A conventional comparator can be either low power or fast switching, but not both. In power converters, there is a need for fast, low-power switch drive circuits responsive to slowly changing feedback signals.

SUMMARY

Switch drive circuits (aka switch drivers) employing current pulse generators are described herein that, in response to a slowly changing voltage or current input level, generate switch drive with fast edges. The example given is a non-isolated buck converter, though the techniques taught can be applied to many different forms of power converter. The control circuits described can consume relatively little power and can combine the functions of a low-power error amplifier, a comparator, a proportional frequency controller, a fast-edged pulse generator, a switch driver, and a maximum rate limiter, among others.

Two current pulse generators are here combined to form a switch driver, one to deliver current to turn on a switch, and a complementary current pulse generator to turn the switch off. The switch driver can be in a relatively high impedance state while the switch is in the on or off state. The time between turn on and turn off may be fixed by a delay circuit or may be controlled adaptively.

In at least one embodiment, a switch driver quickly charges and then discharges the gate of a MOSFET in response to a control signal having relatively slow transitions, while consuming relatively little power. Other possible advantages include tolerance of a wide operating voltage range, an extremely wide range of operative output pulse frequencies and durations, a controllable proportional response region near the regulation point when used in a feed-back system, and a presettable maximum output pulse frequency.

In at least one embodiment, a highly efficient buck converter is shown, requiring just a few transistors to provide control and switch drive.

BRIEF DESCRIPTION OF THE DRAWINGS

Embodiments of the invention will become more fully apparent from the following detailed description, and the accompanying drawings in which like reference numerals identify similar or identical elements.

DETAILED DESCRIPTION

Figure 1:
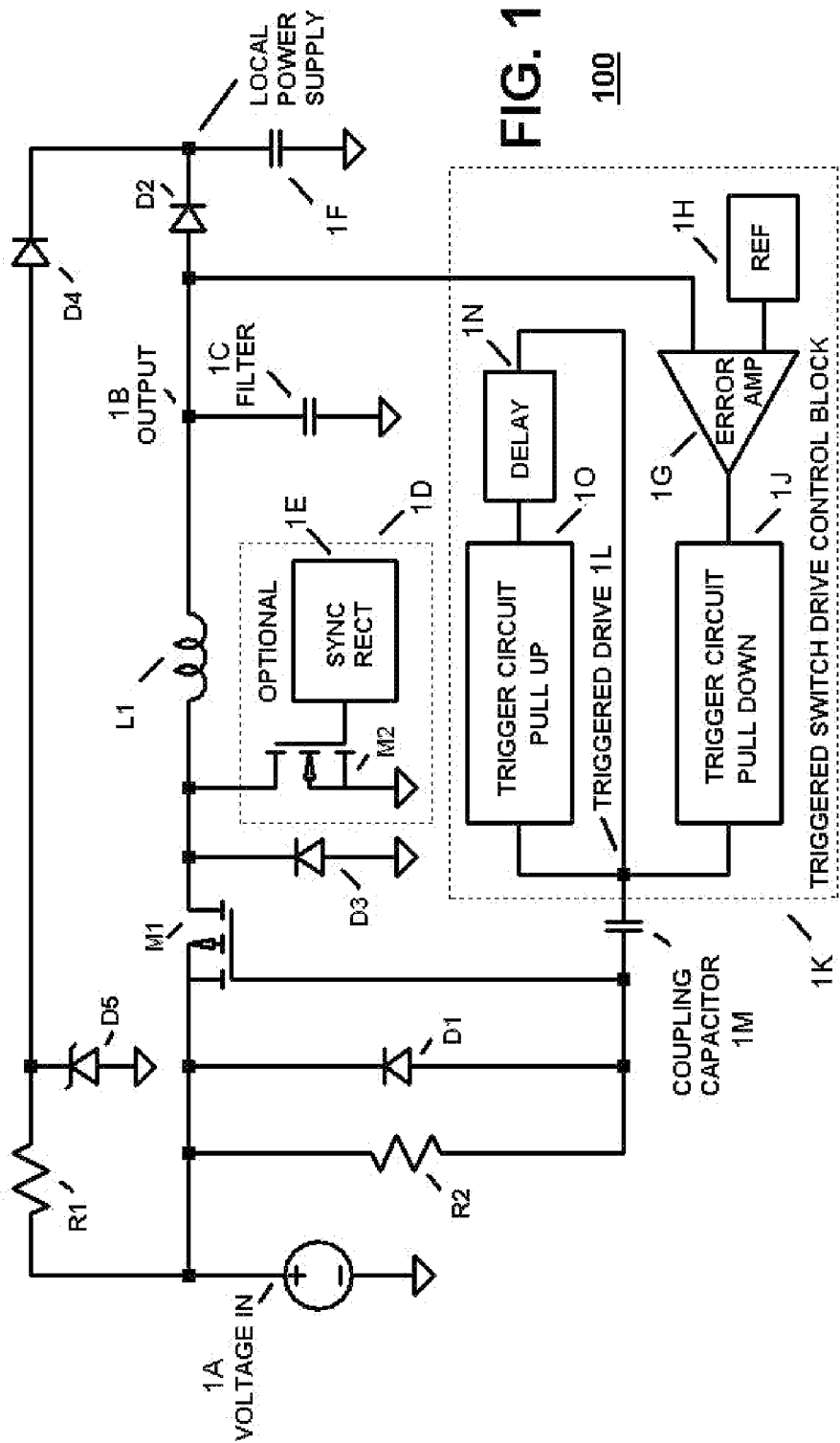
FIG. 1 is a schematic block diagram of a buck power converter that employs triggered current pulse switch drive.

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In certain embodiments, a triggered switch drive circuit of the present invention can provide the control for a buck converter, such as the power converter 100 of FIG. 1, which is described in further detail below. Circuits of the present invention can be used in power converters for a variety of applications, for example, to provide regulated, unisolated DC power for the primary side circuitry in an AC-to-DC converter, or for a DC-to-DC converter with a large ratio of input to output voltage, such as a 48-to-5-volt DC-to-DC converter for a file server or a 72-to-12-volt automotive power converter. A power level from a milliwatt to kilowatts can be provided. The filtered, slowly changing output voltage signal is fed back into the controller which drives the main switching element M1 to regulate the output. In one example, the input to the controller is the slowly changing output of a power converter fed into an error detector, whose error signal output is representative of the difference between the converter's output voltage or current and a desired reference voltage or current. That error signal may be proportional when the error detector is an amplifier or digital when the error detector is a comparator.

In response to the error signal, the switch driver triggers, generating a first current pulse and turning on the FET switch M1 which loads energy into a switched inductor L1. After a preset interval or after an adaptively controlled period, the switch M1 is turned off by a second current pulse generated by the switch driver. The triggered current pulses produce a fast edge to turn on the switch M1 and a fast edge to turn off the switch M1. As described further below, the pulse generators shown in FIG. 3 use a complementary transistor pair with positive feedback to produce fast edges while consuming minimal power.

FIG. 1 is a schematic block diagram of a power converter 100 that employs Triggered Switch Drive (TSD) regulation. The power converter 100 receives DC (e.g., rectified AC) input power at the input node VOLTAGE IN (1A) and produces a DC voltage output at the output node OUTPUT (1B) as smoothed by a capacitor FILTER (1C). Rectifier diode D3 carries the inductive current in switched inductor L1 when the main switch M1 is in the off state. Optional switch M2 is part of a synchronous rectifier (1D) with control (1E) which can reduce the rectification losses in diode D3.

The VOLTAGE IN provides a start-up power source for the Local Power Supply, filtered by the capacitor (1F), through resistor R1, and regulated by zener diode D5, where the zener diode D5 voltage is less than the desired Local Power Supply voltage. Resistor R1 may be many megohms to reduce standby current. A switch (not shown in FIG. 1) can be placed in series with resistor R1, so that the startup power can be switched off entirely once the circuit is in operation. Either the startup power or the output voltage can charge the Local Power Supply filter capacitor (1F) through diode D4 or diode D2, respectively. During normal operation, the local power is provided through the more-efficient path, that is, from the output through diode D2.

The Error Amp (1G) is shown here as comparing the output voltage, OUTPUT, to a voltage reference, REF, from reference voltage generator (1H). The Trigger Circuit Pull Down block (1J) of the triggered switch drive control block (1K) is triggered when the OUTPUT magnitude falls below the reference magnitude. The Triggered Drive node (1L) is pulled rapidly down to near the negative rail by the Trigger Circuit Pull Down block (1J). That negative edge is coupled through the Coupling Capacitor (1M) to the gate of the main FET M1, turning it rapidly on. Resistor R2 assures that main switch M1 is off in the absence of instruction to the contrary. The same edge which turns on the main switch M1 also begins a delay period controlled by a delay circuit (1N), which ends with a second trigger. The second trigger is from the Trigger Circuit Pull Up block (1O). That second trigger is a current pulse which quickly pulls the Triggered Drive node (1L) to near the local power supply voltage. The rapid rise of the Triggered Drive node (1L) couples through the Coupling Capacitor (1M) turning off main switch M1. Diode D1 assures that the main switch gate does not go much above the source terminal of the main switch M1.

The result of that feedback mechanism is a frequency of operation of M1 that increases with increasing load. The maximum frequency of operation is set in the Trigger Circuit Pull Down block (1J) as shown below in FIG. 3. The practical output voltage range for power converter 100 can be from under 5 volts to over 30 volts. A low turn-on voltage FET for the main switch M1 is best for 5 volts output, and a zener diode clamp, such as diode D12 in FIG. 5, should parallel diode D1 for output voltages approaching or above the recommended maximum source-to-gate voltage at the main FET M1. With these precautions, the output is the only regulated voltage required.

Figure 5:
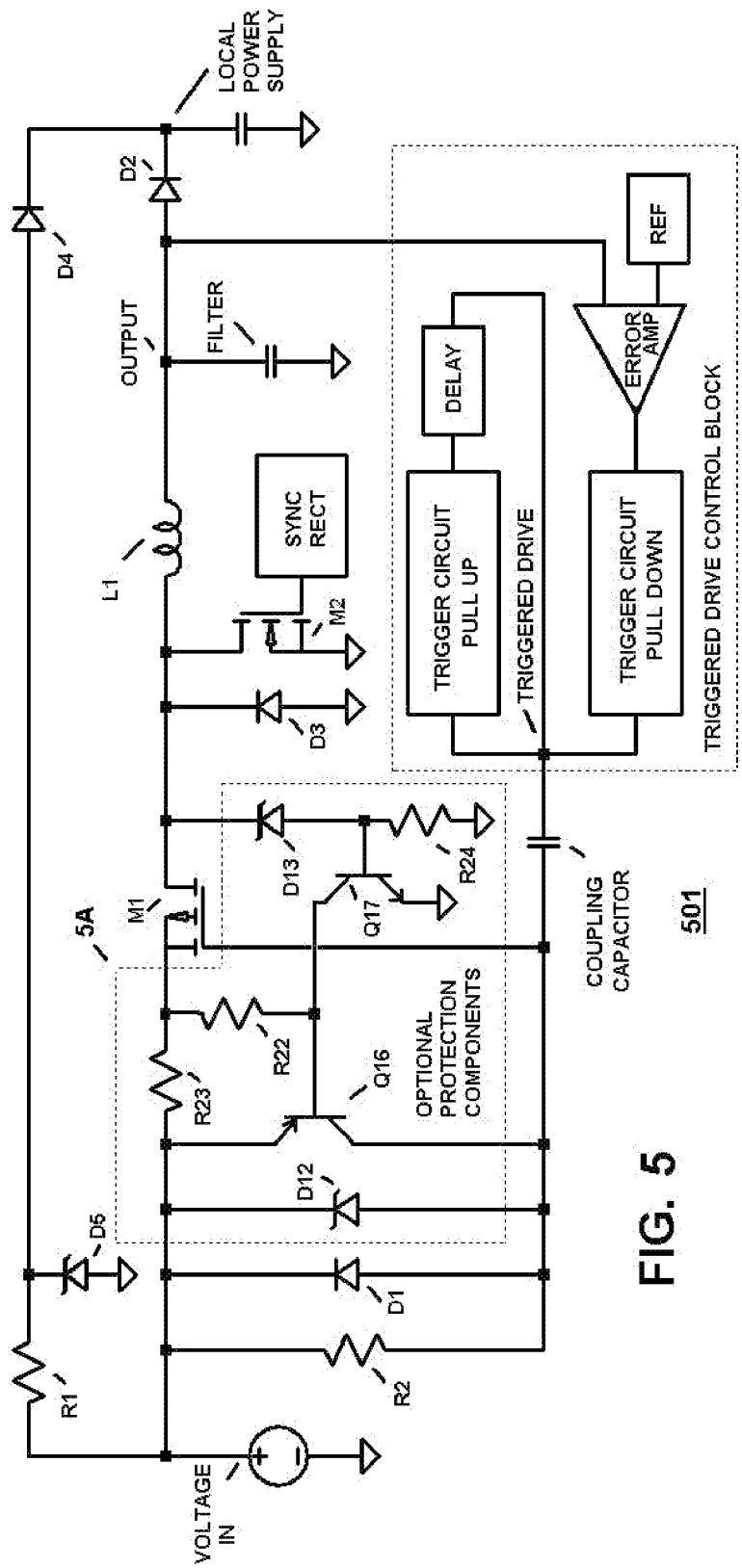
FIG. 5 shows a power converter similar to the buck power converter of FIG. 1 with optional protection circuitry added.

Conventional methods to force the main switch M1 to turn off in the presence of over voltage or over current can be implemented with simple additional protection circuitry, as shown in FIG. 5. The optional synchronous rectification will increase efficiency through control SYNC RECT (1E) turning on switch M2 whenever diode D3 would otherwise be conducting.

In alternative implementations of the power converter 100, the output voltage can be resistively divided before being applied to the error amplifier, with the reference voltage REF similarly reduced to a lower voltage level.

Figure 2:
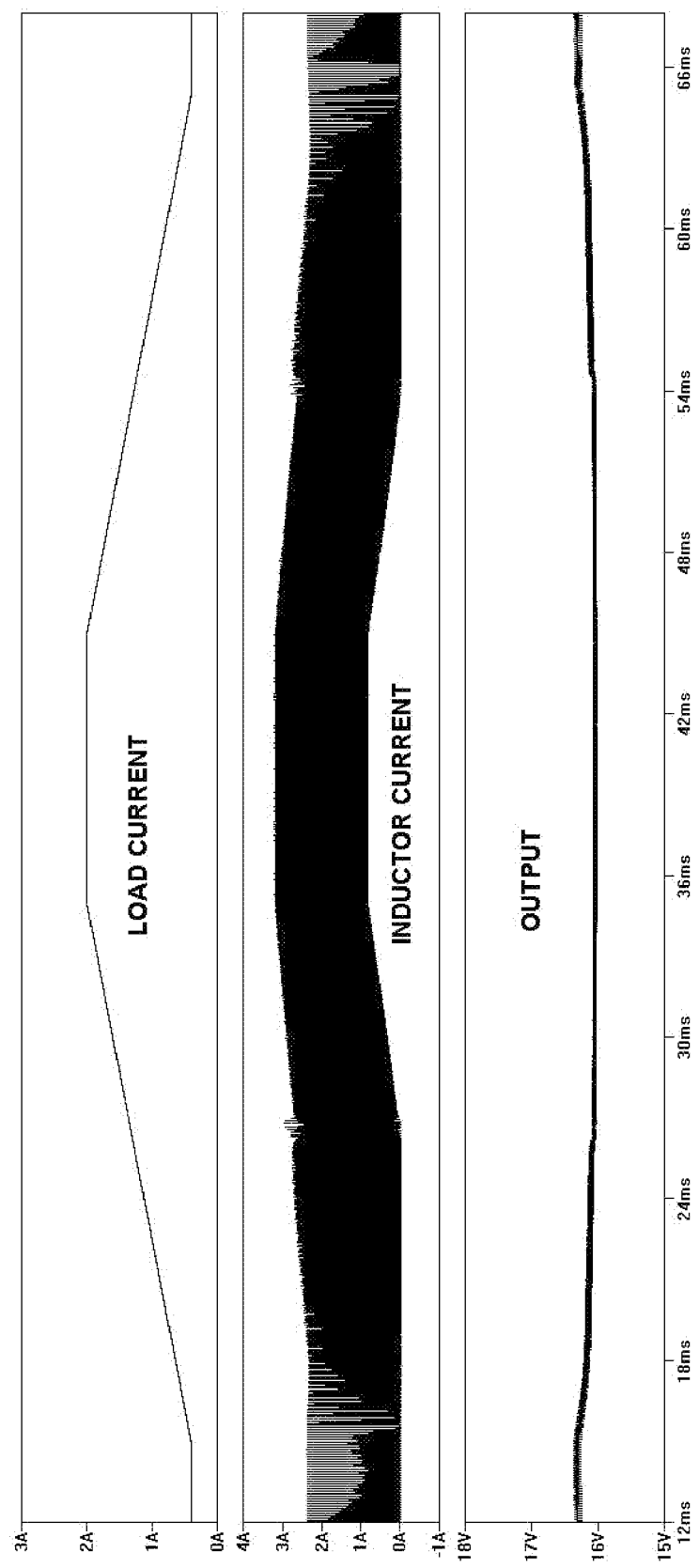
FIG. 2 shows simulated SPICE waveforms for the power converter of FIGS. 1 and 3.

FIG. 2 shows simulated SPICE waveforms for the power converter 100 of FIG. 1. In the top trace, the load current is seen rising from 0.4 amps to 2 amps and returning to 0.4 amps. The current in the switched inductor, L1, is shown in the middle trace. At about 24 ms, the converter transitions smoothly from discontinuous conduction mode (DCM) to continuous conduction mode (CCM). At about 54 ms, the converter transitions smoothly from continuous back to discontinuous conduction mode.

The bottom trace shows the output voltage, nominally 16.5 volts here. The output voltage stays within 250 my over the 5-to-1 variation in load current shown. Better output regulation is easily obtained if a small amount of subharmonic behavior can be tolerated at the DCM/CCM transitions. With extra circuitry to adjust the output voltage, both smooth DCM/CCM transitions and exemplary output regulation can be achieved.

Figure 3:
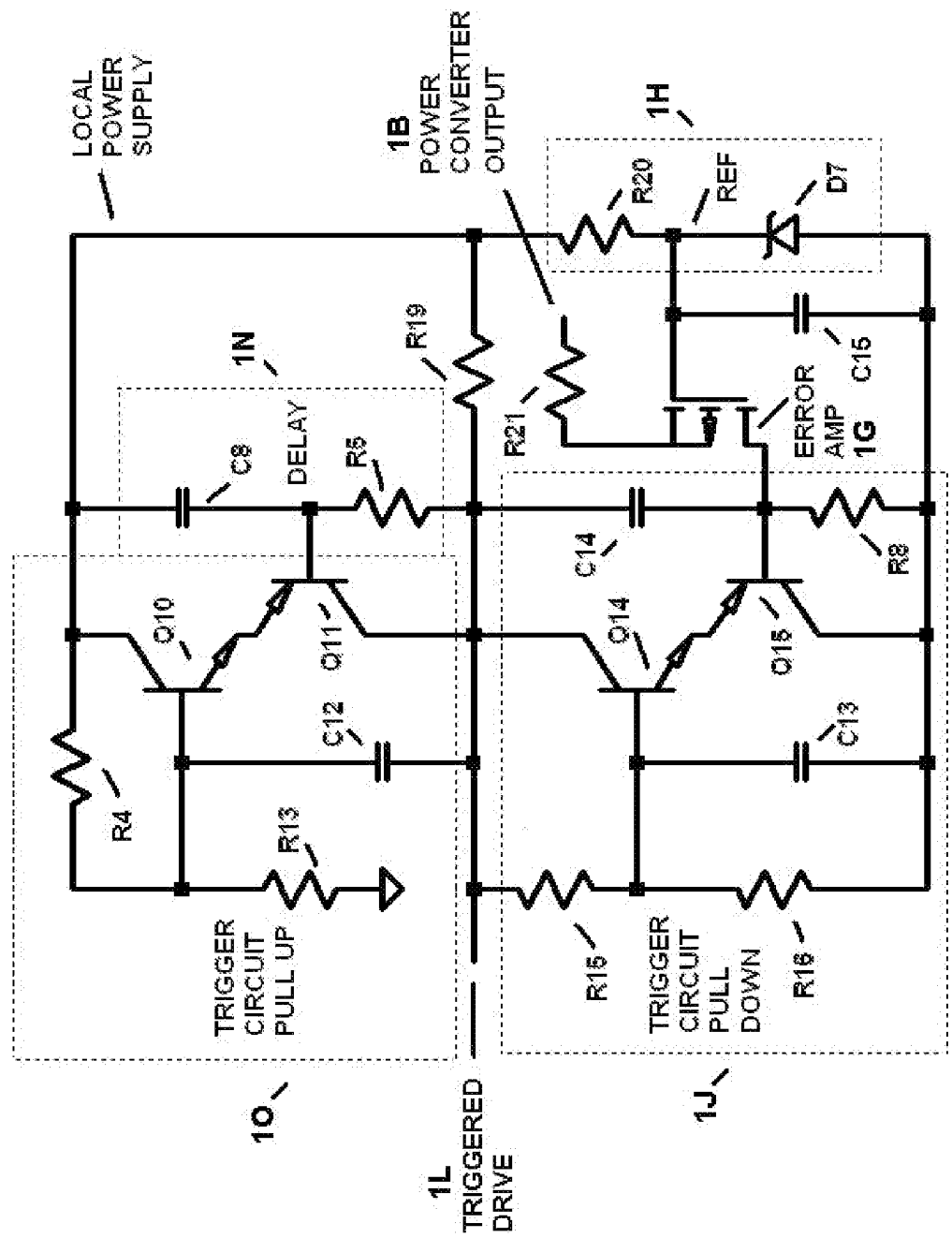
FIG. 3 is a detailed schematic circuit diagram of the regulation and triggered switch drive circuitry shown in FIG. 1.

FIG. 3 is a detailed schematic circuit diagram of the Triggered Switch Driver (1K) of FIG. 1. The Reference voltage, REF, is set by zener diode, D7, excited by a current determined by a current setting resistor, R20. The Error Amp is a single n-type FET, ERROR AMP, with its gate at the reference voltage, REF. The power converter output, OUTPUT is connected to the drain of the Error Amp FET (1G) through a gain-setting resistor, R21. In the inactive state (i.e., when transistors Q10, Q11, Q14, and Q15 are all off), the Triggered Drive node (1L) is pulled up to near the Local Power Supply voltage by resistor R19. If the power converter output is below the reference voltage REF, then the Error Amp FET (1G) will not draw any current. In that case, the discharge resistor, R8, pulls down the voltage at capacitor C14 until the pull-down trigger circuit (1J) fires. When the pull-down trigger circuit (1J) fires, transistors Q14 and Q15 turn on hard due to positive feedback. Capacitor C14 provides positive feedback for Q15, and capacitor C13 provides positive feedback for Q14. The pulse of current through transistors Q14 and Q15 continues until the Triggered Drive node (1L) is pulled near the negative rail. That negative transition, coupled through the Coupling Capacitor (1M) of FIG. 1, turns on the p-type main FET switch, M1.

The trigger threshold for the pull-down action of transistors Q14 and Q15 is set by a voltage divider made up of resistors R15 and R16. When the voltage at the base of trigger transistor Q15 falls below two base-emitter drops less than the voltage at the base of trigger transistor Q14, both transistors turn on rapidly due to the positive feedback from capacitors C13 and C14. The Triggered Drive transition to the on state begins the delay period, set by delay timing resistor R5 and delay timing capacitor C8 of the delay circuit (1N). In the same fashion that the Trigger Circuit Pull Down (1J) generates a current pulse when triggered, the Trigger Circuit Pull Up (1O) generates a current pulse when the voltage at the base of trigger transistor Q11 falls below two base-emitter drops less than the voltage at the base of trigger transistor Q10. At that instant, both transistors turn on rapidly due to positive feedback from capacitors C8 and C12. The Triggered Drive output (1L) is quickly drawn to near the positive rail by the current pulse in trigger transistors Q10 and Q11. The positive transition couples through the Coupling Capacitor (1M) shown in FIG. 1 to turn off the p-type main power FET. In this case, the pull up threshold voltage is set a little below the Local Power Supply by a voltage divider of resistor R4 and resistor R13.

When the Triggered Drive node (1L) is pulled high, turning off the pFET switch M1, coupling through capacitor C14 insures the Q14 and Q15 transistor pair stays off, and begins another discharge cycle of C14 through resistor R8. Capacitor C12, in similar fashion, assures that the Trigger Circuit Pull Up (1O) is inactive when the Trigger Circuit Pull Down (1J) pulses. The maximum frequency of operation can be adjusted by changing the values of the timing elements, i.e., resistor R8 and capacitor C14.

If the Error Amp (1G) indicates that the output voltage OUTPUT is sufficiently above the reference voltage REF, then the Error Amp (1G) stops the discharging of capacitor C14 which prevents further triggering. In particular, when the output voltage rises more than the FET turn-on threshold above the reference voltage REF, the Error Amp FET (1G) draws discharge current, set by resistor R8, away from the timing capacitor, C14. That redirected current slows, or stops, the discharging of C14 by timing resistor R8. When the Error Amp FET (1G) is turned completely on, no discharging of C14 and no triggering of transistors Q14 and Q15 will occur.

Unless slowed by the Error Amp FET (1G), the Triggered Switch Driver (1K) will run at its maximum frequency. If resistor R21 is small, output regulation will be improved. Increasing resistor R21 delays the feedback which enlarges the region of proportional control. In the region of proportional control, the switching frequency is in proportion to the difference between the reference REF and the output OUTPUT. That proportional behavior helps provide smooth transitions into and out of CCM operation.

Figure 4:
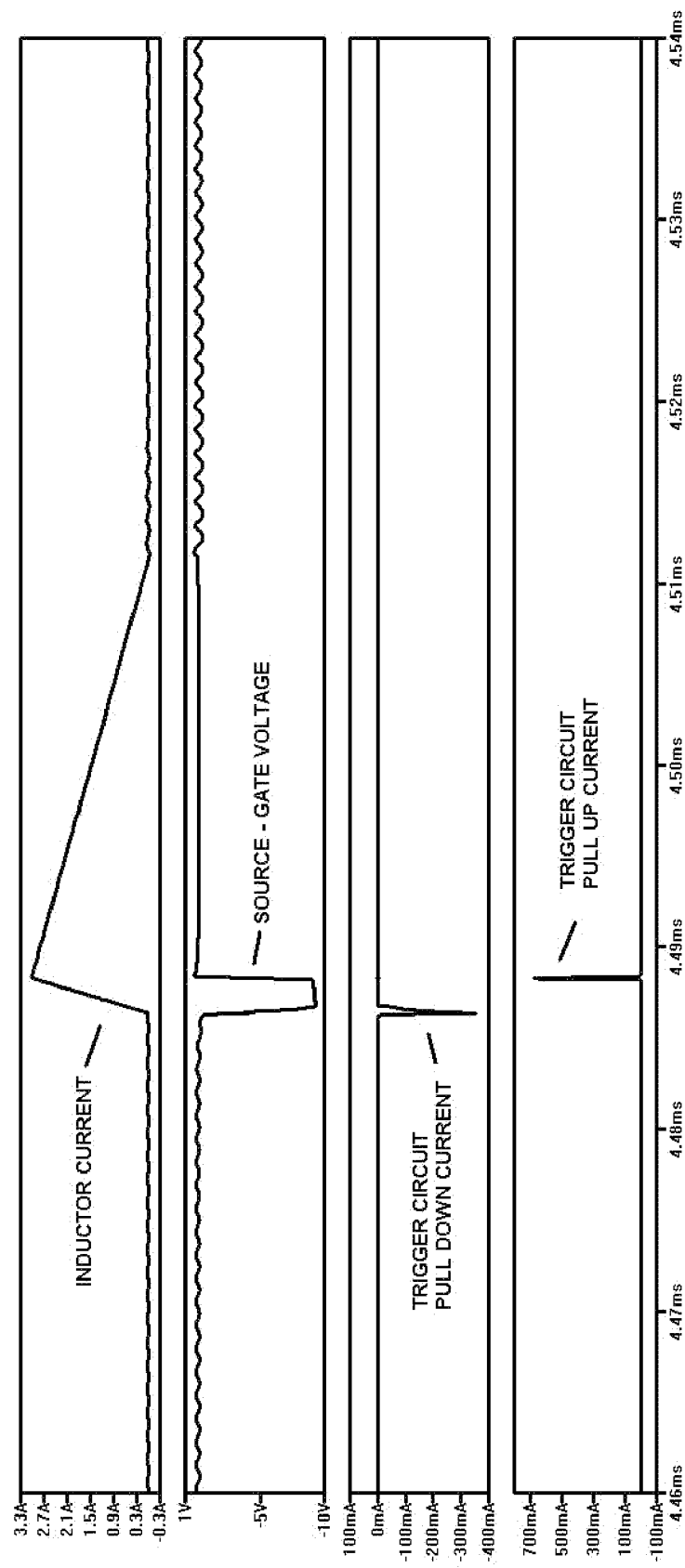
FIG. 4 shows simulated SPICE waveforms for the triggered drive circuit of FIGS. 1 and 3.

FIG. 4 shows simulated SPICE waveforms for the triggered switch drive circuitry (1K) of power converter 100 of FIG. 1. In the top trace, the switched inductor current is shown for one charge/discharge cycle during DCM operation. The second trace shows the source-gate voltage of the main FET M1. That source-gate voltage is a level-shifted duplicate of the Triggered Drive node (1L) voltage, as coupled by the Coupling Capacitor (1M). When that voltage is low, the main FET M1 is on and the inductor L1 charges. The source-gate voltage is pulled low by a current pulse drawn though transistors Q14 and Q15 in the Trigger Circuit Pull Down block (1J), as shown in FIG. 3. That current pulse is seen as the third trace of FIG. 4. The trigger circuit pull up (1O) current shown in the fourth trace turns off the main switch M1 by rapidly pulling the Triggered Drive node (1L) in the positive direction. That current pulse flows through transistors Q10 and Q11 in the Trigger Circuit Pull Up block (1O) after the Delay period has transpired.

FIG. 5 shows power converter 501. It is similar to the buck power converter 100 of FIG. 1 with optional protection circuitry (5A) added. Zener diode D12 limits the source-gate voltage at main FET M1 to a safe value. p-type transistor Q16, when turned on, assures that main FET M1 will be off. Here, there are two conditions that will turn on transistor Q16. First, if enough voltage develops across current-sense resistor R23, then transistor Q16 will be turned on through resistor R22. The maximum allowed current is thereby set by the value of sense resistor R23. Second, if the output voltage OUTPUT rises above a maximum voltage, then transistor Q16 will also be turned on, limiting further voltage rise at the output. That maximum voltage is set by the voltage of zener diode D13. When the zener diode D13 conducts, the base of n-type transistor Q17 will rise, turning on transistor Q17, causing it to turn on transistor Q16 by pulling down its base. Resistor R24 insures that transistor Q17 remains off during normal operation. For further protection, other conditions can be made to force the Main FET M1 to turn off with appropriate additional circuitry.

As with any power converter, care must be taken to insure safe startup. The pulse generators (1K) shown can operate on just 2 volts, so predictable behavior is arrived at very early in the start-up process. A capacitor in parallel with the reference diode, D7, e.g., optional capacitor C15 in FIG. 3, will cause the reference REF to ramp up at power on, so that the converter (e.g., 100 or 501) can quickly reach the regulation point and stay in regulation while climbing to the desired output level.

Note that the fixed turn-off delay circuit (1N) shown in FIG. 3 results in a fixed on time for the main switch M1. The Trigger Circuit Pull Up (1O) could alternatively be triggered by other circuitry to produce any desired on time. Also, the turn-on threshold voltage at the base of transistor Q10 can be actively adjusted to achieve an adaptive on time. For that matter, the primary control could be applied to the on-time delay to regulate the output. The start of each cycle could then be based on a set frequency.

The distinction between pulse width modulation (PWM) and pulse frequency modulation (PFM) is blurred in modern power converters. The frequency of operation may be slowed in a PWM converter to save power, or the amount of power moved per cycle in a PFM converter can be modulated to alter the operating frequency. In this case, feedback from the Error Amp (1G) can be applied to either or both the Trigger Circuit Pull Down (1J) or the Trigger Circuit Pull Up (1O) in order to provide multiple means to regulate the output. Such feedback can either modulate the trigger reference voltages for pull up or pull down, or can modulate the rate of charge or discharge of the timing capacitors. U.S. Pat. No. 10,554,206 teaches a number of such techniques. An additional input could be provided to control the added modulators which could determine to what degree the regulation would be done through PWM and what degree of the regulation would be done by PFM.

Also note that this circuit is configured to drive a PMOS FET, the gate of which pulls down to turn on. To drive an NMOS FET, the top and bottom halves of the circuit shown in FIG. 3 could be exchanged, to generate a drive signal that is active when high. One skilled in the art can move the main FET M1 to the low side and use an NMOS-type switch. The coupling capacitor might not be needed in that situation. The disadvantage in that alternative case is that ground is no longer connected directly between the input side and the output side. In many situations, that is not a practical limitation. We have shown the PMOS case here since it is the more general, and because with modern parts, there is very little efficiency penalty in selecting PMOS instead of NMOS. When the Triggered Drive is used in a flyback converter, the usual arrangement would be an inverted form of the triggered driver (1K) driving an NMOS switch on the ground side of a switched inductor.

Simulations indicate that the power converter, 100, of FIG. 1 can approach 98% efficiency. Furthermore, due to the simplicity and efficiency of the control circuitry, standby power is very low. That enables exceptional low-load efficiency. Efficiency can still be 94% at 1% of full load.

Conventional buck converters produce their best efficiencies around a 50% duty cycle. That limits the ratio of input voltage to output voltage for an efficient buck converter. The converter of FIG. 1 runs efficiently with rectified universal AC as the input. An output of 12 volts can be efficiently derived from an input of 300 volts, because the switching losses are low. That is important with the short on times indicated for such extreme voltage ratios.

Those skilled in the art will understand that HEMT (high-electron-mobility transistor) FETS can be used in place of MOS (metal-oxide-semiconductor) FETS, and/or that output current, instead of output voltage can be regulated. Also, the output polarity can be positive or negative.

Although the invention has been described so far in the context of a buck power converter, or other power converter regulator, the invention is not so limited. In general, the invention can be implemented to provide switch drive for FETS in any application with delimited on times. Those other applications include cases where a comparator function requires a fast output edge in response to a slow input, consistent with low power consumption. For that matter, the triggered drive circuit can drive any suitable reactive (e.g., capacitive or inductive) load, not necessarily a FET. Possible reactive loads include piezo transducers and synchronous motors.

The pulse generators are here shown constructed from bipolar transistors. They could as easily be made with FETs.

In power converter 100 of FIG. 1, the main switch M1 is an example of a driven circuit configured to transition between a first state (i.e., off) and a second state (i.e., on), while the triggered switch drive control block (1K) is an example of a driver circuit configured to generate drive signals at the triggered drive node (1L) to drive the driven circuitry to transition between the first and second states. The trigger circuit pull down block (1J) is an example of a first-to-second driver circuit configured to generate a first drive signal to drive the driven circuitry to transition from the first state to the second state, and the trigger circuit pull up block (1O) is an example of a second-to-first driver circuit configured to generate a second drive signal to drive the driven circuitry to transition from the second state to the first state. The error amp (1G) is an example of first control circuitry connected to control triggering of the first-to-second driver circuit to drive the driven circuitry to transition from the first state to the second state, and the delay circuit (1N) is an example of second control circuitry connected to control triggering of the second-to-first driver circuit to drive the driven circuitry to transition from the second state to the first state.

According to certain embodiments, an article of manufacture comprises (i) driven circuitry configured to transition between first and second states and (ii) driver circuitry configured to generate drive signals to drive the driven circuitry to transition between the first and second states. The driver circuitry comprises (i) a first-to-second driver circuit configured to generate a first drive signal to drive the driven circuitry to transition from the first state to the second state and (ii) a second-to-first driver circuit configured to generate a second drive signal to drive the driven circuitry to transition from the second state to the first state. Each driver circuit comprises (i) an n-type transistor having a base, a collector, and an emitter and characterized by a turn-on threshold voltage; (ii) a p-type transistor having a base, a collector, and an emitter and characterized by a turn-on threshold voltage, wherein the collector and emitter of the n-type transistor are connected in series with the collector and emitter of the p-type transistor such that, when the two transistors are turned on, current flows from the collector of the n-type transistor to the collector of the p-type transistor; and (iii) a positive-feedback capacitor connected between the collector of a first of the two transistors and the base of a second of the two transistors. The trigger circuit is configured such that (i) the two transistors turn on together when the voltage at the base of the n-type transistor exceeds the voltage at the base of the p-type transistor by at least the sum of the turn-on threshold voltages of the two transistors and (ii) the two transistors turn off together when the voltage at the base of the n-type transistor fails to exceed the voltage at the base of the p-type transistor by at least the sum of the turn-on threshold voltages of the two transistors. The positive-feedback capacitor ensures that the two transistors turn fully on and off together.

According to some or all of the above embodiments, the driver circuitry further comprises (i) first control circuitry connected to control triggering of the first-to-second driver circuit to drive the driven circuitry to transition from the first state to the second state and (ii) second control circuitry connected to control triggering of the second-to-first driver circuit to drive the driven circuitry to transition from the second state to the first state.

According to some or all of the above embodiments, (i) the first control circuitry is an error amplifier configured to compare a feedback signal to a reference signal to determine when to trigger the first-to-second driver circuit and (ii) the second control circuitry is a delay circuit configured to trigger the second-to-first driver circuit after a delay period following triggering of the first-to-second driver circuit, such that the driven circuit remains in the second state for the delay period.

According to some or all of the above embodiments, the driven circuitry comprises a switch, wherein the switch is (i) off in the first state and (ii) on in the second state, the first-to-second driver circuit is configured to turn the switch on, and the second-to-first driver circuit is configured to turn the switch off.

According to some or all of the above embodiments, the switch comprises a transistor switch having a control node, and the driver circuit is connected to apply the drive signals to the control node of the transistor switch.

According to some or all of the above embodiments, the driver circuit is connected to apply the drive signals to the control node of the transistor switch via coupling circuitry.

According to some or all of the above embodiments, the driven circuitry and the driver circuitry are part of a power converter; the driven circuitry comprises an input switch that controls whether or not input power is applied to the power converter, wherein the input switch is (i) off in the first state and (ii) on in the second state; the first-to-second driver circuit is configured to turn the input switch on; and the second-to-first driver circuit is configured to turn the input switch off.

According to some or all of the above embodiments, the power converter is a buck power converter.

According to some or all of the above embodiments, for at least one of the driver circuits, the first transistor is the n-type transistor, the second transistor is the p-type transistor, and the positive-feedback capacitor is connected between the collector of the n-type transistor and the base of the p-type transistor.

According to some or all of the above embodiments, the article further comprises a timing capacitor connected to the base of the n-type transistor and configured to be charged when the two transistors are off and discharged when the two transistors are on. The charging of the timing capacitor causes the two transistors to turn on, and the discharging of the timing capacitor contributes to a current pulse through the two transistors.

According to some or all of the above embodiments, for at least one of the driver circuits, the first transistor is the p-type transistor, the second transistor is the n-type transistor, and the positive-feedback capacitor is connected between the collector of the p-type transistor and the base of the n-type transistor.

According to some or all of the above embodiments, the article further comprises a timing capacitor connected to the base of the p-type transistor and configured to be charged when the two transistors are off and discharged when the two transistors are on. The charging of the timing capacitor causes the two transistors to turn on, and the discharging of the timing capacitor contributes to a current pulse through the two transistors.

Embodiments of the invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals, voltages, or currents and corresponding terminals, nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a field-effect transistor (FET) device, the term "channel" refers to the path through the device between the source and the drain, and the term "control node" refers to the gate of the device. Similarly, the terms "emitter," "collector," and "base" should be understood to refer respectively either to the emitter, collector, and base of a bi-polar device or to the source, drain, and gate of a FET device if an embodiment of the invention is implemented using FET transistor technology, and vice versa.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

All documents mentioned herein are hereby incorporated by reference in their entirety or alternatively to provide the disclosure for which they were specifically relied upon.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

What is claimed is:
1. An article of manufacture comprising:
   driven circuitry configured to transition between first and second states; and
   driver circuitry configured to generate drive signals to drive the driven circuitry to transition between the first and second states, the driver circuitry comprising:

a first-to-second driver circuit configured to generate a first drive signal to drive the driven circuitry to transition from the first state to the second state; and a second-to-first driver circuit configured to generate a second drive signal to drive the driven circuitry to transition from the second state to the first state, wherein each driver circuit comprises:

an n-type transistor having a base, a collector, and an emitter and characterized by a turn-on threshold voltage;

a p-type transistor having a base, a collector, and an emitter and characterized by a turn-on threshold voltage, wherein the collector and emitter of the n-type transistor are connected in series with the collector and emitter of the p-type transistor such that, when the two transistors are turned on, current flows from the collector of the n-type transistor to the collector of the p-type transistor; and a positive-feedback capacitor connected between the collector of a first of the two transistors and the base of a second of the two transistors, wherein:

the trigger circuit is configured such that (i) the two transistors turn on together when the voltage at the base of the n-type transistor exceeds the voltage at the base of the p-type transistor by at least the sum of the turn-on threshold voltages of the two transistors and (ii) the two transistors turn off together when the voltage at the base of the n-type transistor fails to exceed the voltage at the base of the p-type transistor by at least the sum of the turn-on threshold voltages of the two transistors; and the positive-feedback capacitor ensures that the two transistors turn fully on and off together.

2. The article of claim 1, wherein the driver circuitry further comprises:

first control circuitry connected to control triggering of the first-to-second driver circuit to drive the driven circuitry to transition from the first state to the second state; and second control circuitry connected to control triggering of the second-to-first driver circuit to drive the driven circuitry to transition from the second state to the first state.

3. The article of claim 2, wherein:

the first control circuitry is an error amplifier configured to compare a feedback signal to a reference signal to determine when to trigger the first-to-second driver circuit; and the second control circuitry is a delay circuit configured to trigger the second-to-first driver circuit after a delay period following triggering of the first-to-second driver circuit, such that the driven circuit remains in the second state for the delay period.

4. The article of claim 1, wherein:

the driven circuitry comprises a switch, wherein the switch is (i) off in the first state and (ii) on in the second state;

the first-to-second driver circuit is configured to turn the switch on; and the second-to-first driver circuit is configured to turn the switch off.

5. The article of claim 4, wherein:

the switch comprises a transistor switch having a control node; and the driver circuit is connected to apply the drive signals to the control node of the transistor switch.

6. The article of claim 5, wherein the driver circuit is connected to apply the drive signals to the control node of the transistor switch via coupling circuitry.

7. The article of claim 1, wherein:

the driven circuitry and the driver circuitry are part of a power converter;

the driven circuitry comprises an input switch that controls whether or not input power is applied to the power converter, wherein the input switch is (i) off in the first state and (ii) on in the second state;

the first-to-second driver circuit is configured to turn the input switch on; and the second-to-first driver circuit is configured to turn the input switch off.

8. The article of claim 7, wherein the power converter is a buck power converter.

9. The article of claim 1, wherein, for at least one of the driver circuits:

the first transistor is the n-type transistor;

the second transistor is the p-type transistor; and the positive-feedback capacitor is connected between the collector of the n-type transistor and the base of the p-type transistor.

10. The article of claim 9, further comprising a timing capacitor connected to the base of the n-type transistor and configured to be charged when the two transistors are off and discharged when the two transistors are on, wherein:

the charging of the timing capacitor causes the two transistors to turn on; and the discharging of the timing capacitor contributes to a current pulse through the two transistors.

11. The article of claim 1, wherein, for at least one of the driver circuits:

the first transistor is the p-type transistor;

the second transistor is the n-type transistor; and the positive-feedback capacitor is connected between the collector of the p-type transistor and the base of the n-type transistor.

12. The article of claim 11, further comprising a timing capacitor connected to the base of the p-type transistor and configured to be charged when the two transistors are off and discharged when the two transistors are on, wherein:

the charging of the timing capacitor causes the two transistors to turn on; and the discharging of the timing capacitor contributes to a current pulse through the two transistors.

* * * * *